United States Patent
Ting et al.

(10) Patent No.: US 9,543,404 B2
(45) Date of Patent: Jan. 10, 2017

(54) VERTICAL BJT FOR HIGH DENSITY MEMORY

(71) Applicant: Taiwan Semiconductor Manufacturing Co., Ltd., Hsin-Chu (TW)

(72) Inventors: Yu-Wei Ting, Taipei (TW); Chun-Yang Tsai, Hsinchu (TW); Kuo-Ching Huang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/826,318

(22) Filed: Aug. 14, 2015

(65) Prior Publication Data
US 2015/0349086 A1    Dec. 3, 2015

Related U.S. Application Data

(62) Division of application No. 13/723,762, filed on Dec. 21, 2012, now Pat. No. 9,153,672.

(51) Int. Cl.
H01L 27/00    (2006.01)
H01L 29/66    (2006.01)
(Continued)

(52) U.S. Cl.
CPC ......... *H01L 29/66333* (2013.01); *G11C 11/40* (2013.01); *G11C 13/0002* (2013.01);
(Continued)

(58) Field of Classification Search
CPC .................................................... H01L 27/00
(Continued)

(56) References Cited

U.S. PATENT DOCUMENTS 4,958,320 A    9/1990 Homma et al.
5,346,836 A    9/1994 Manning et al.
(Continued)

FOREIGN PATENT DOCUMENTS

KR    20010017881 A    3/2001
TW    439268    6/2001
(Continued)

OTHER PUBLICATIONS

Ching-Hua Wang, et al. "Three-Dimensional 4F2 ReRAM Cell with CMOS Logic Compatible Process." Electron Devices Meeting (IEDM), 2010 IEEE International , vol., No., pp. 29.6.1-29.6.4, Dec. 6-8, 2010. 4 Pages.
(Continued)

*Primary Examiner* — Min Huang
(74) *Attorney, Agent, or Firm* — Eschweiler & Associates, LLC

(57) ABSTRACT

Some aspects of this disclosure relate to a memory device. The memory device includes a collector region having a first conductivity type and which is coupled to a source line of the memory device. A base region is formed over the collector region and has a second conductivity type. A gate structure is coupled to the base region and acts as a shared word line for first and second neighboring memory cells of the memory device. First and second emitter regions are formed over the base region and have the first conductivity type. The first and second emitter regions are arranged on opposite sides of the gate structure. First and second contacts extend upwardly from the first and second emitter regions, respectively, and couple the first and second emitter regions to first and second data storage elements, respectively, of the first and second neighboring memory cells, respectively.

20 Claims, 6 Drawing Sheets

(51) Int. Cl.
  *H01L 27/24* (2006.01)
  *G11C 11/40* (2006.01)
  *H01L 29/732* (2006.01)
  *H01L 29/82* (2006.01)
  *H01L 45/00* (2006.01)
  *G11C 13/00* (2006.01)
  *H01L 27/22* (2006.01)

(52) U.S. Cl.
  CPC ........ *G11C 13/003* (2013.01); *G11C 13/0069* (2013.01); *H01L 27/228* (2013.01); *H01L 27/2436* (2013.01); *H01L 27/2445* (2013.01); *H01L 27/2454* (2013.01); *H01L 29/66272* (2013.01); *H01L 29/732* (2013.01); *H01L 29/82* (2013.01); *H01L 45/04* (2013.01); *G11C 2213/79* (2013.01)

(58) Field of Classification Search
  USPC .......................................................... 365/148
  See application file for complete search history.

(56) References Cited

U.S. PATENT DOCUMENTS

| | | | |
|---|---|---|---|
| 5,346,863 A | 9/1994 | Hikata et al. | |
| 5,801,420 A | 9/1998 | Fujishima | |
| 5,998,820 A | 12/1999 | Chi | |
| 6,392,273 B1 | 5/2002 | Chang | |
| 2003/0007382 A1 | 1/2003 | Bohm et al. | |
| 2008/0067584 A1* | 3/2008 | Lui | H01L 21/823487 257/330 |
| 2008/0099852 A1* | 5/2008 | Faul | H01L 21/26513 257/382 |
| 2010/0226165 A1* | 9/2010 | Kang | G11C 5/02 365/148 |
| 2011/0140169 A1* | 6/2011 | Briere | H01L 21/28587 257/192 |
| 2011/0248233 A1* | 10/2011 | Pellizzer | H01L 27/2445 257/1 |
| 2012/0025288 A1* | 2/2012 | Doris | H01L 27/10829 257/301 |
| 2012/0049934 A1* | 3/2012 | Shih | H01L 27/0259 327/534 |
| 2012/0217463 A1 | 8/2012 | Hwang | |
| 2013/0076393 A1 | 3/2013 | Stephani et al. | |
| 2013/0270501 A1* | 10/2013 | Toh | H01L 45/04 257/2 |

FOREIGN PATENT DOCUMENTS

| | | |
|---|---|---|
| TW | 200616209 | 5/2006 |
| TW | I280656 | 5/2007 |

OTHER PUBLICATIONS

Notice of Allowance Dated Jun. 18, 2014 Korean Patent Application No. 1020130023880.
Non-Final Office Action dated Aug. 27, 2014 for U.S. Appl. No. 13/723,762.
Final Office Action dated Dec. 16, 2014 for U.S. Appl. No. 13/723,762.
Notice of Allowance dated Apr. 3, 2015 for U.S. Appl. No. 13/723,762.

* cited by examiner

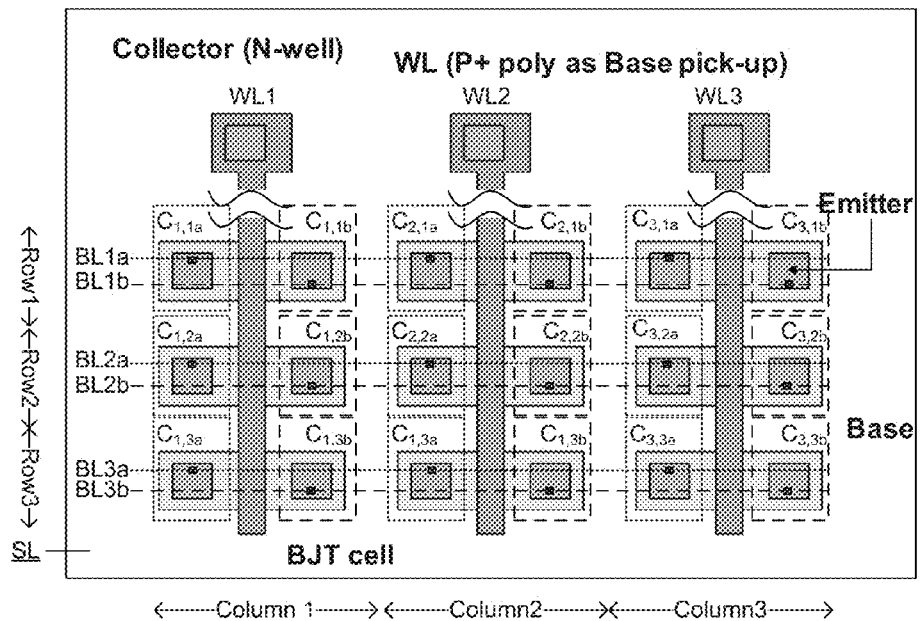
FIG. 1
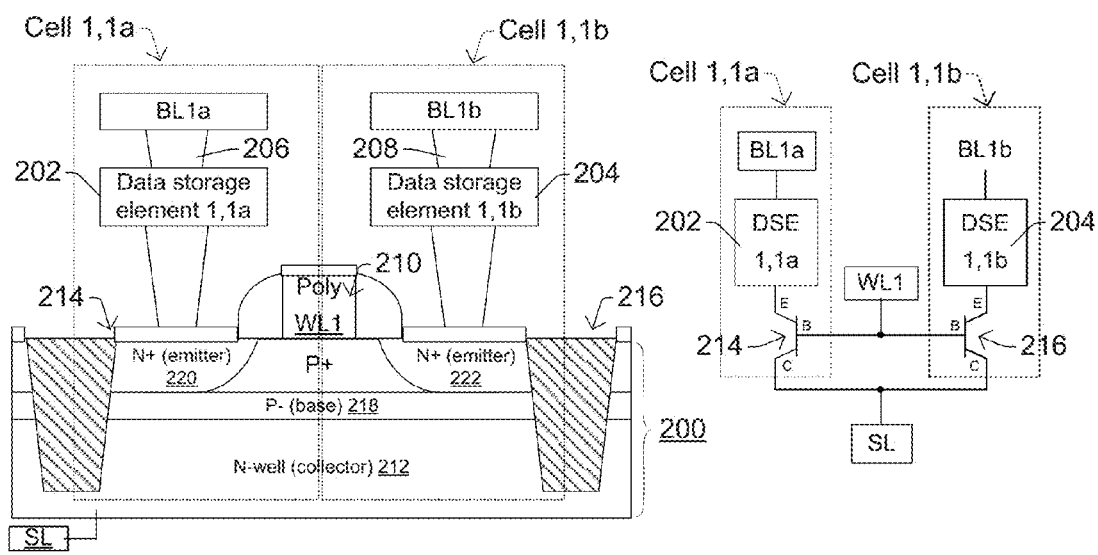
FIG. 2A  Fig. 2B

VERTICAL BJT FOR HIGH DENSITY MEMORY

REFERENCE TO RELATED APPLICATION

This application is a Divisional of U.S. application Ser. No. 13/723,762 filed on Dec. 21, 2012, the contents of which are incorporated by reference in their entirety.

BACKGROUND

Computer memory is a technology consisting of semiconductor devices arranged to retain digital data. It is a fundamental component of computers. Resistive random access memory (RRAM) and magnetic random access memory (MRAM) are two types of memory garnering attention.

In RRAM, the basic idea is that a resistance of a dielectric can be changed to store different states depending on the voltage applied to it. To form an array, a number of memory elements can be arranged in a configuration where parallel bitlines are crossed by perpendicular wordlines with the variable resistance dielectric placed between wordline and bitline at every cross-point. This configuration is called a cross-point cell. Unfortunately, since this architecture can lead to a large "sneak" parasitic current flowing through non selected memory cells via neighboring cells, the cross-point array has a very slow read access. An access element can be added to improve the situation, but conventional access elements consume significant area on the chip. The present disclosure relates to vertical bipolar junction transistors (BJTs) that can be used as access elements to reduce the area of individual memory cells, thereby increasing the density of the memory array.

BRIEF DESCRIPTION OF THE DRAWINGS

FIG. 1 shows a top view of some embodiments of a portion of a memory device.

FIG. 2A shows a cross-sectional view of some embodiments of first and second neighboring memory cells consistent with FIG. 1's embodiments.

FIG. 2B is a schematic representation of some embodiments of first and second neighboring memory cells consistent with FIG. 2A's embodiments.

DETAILED DESCRIPTION

Figure 3:
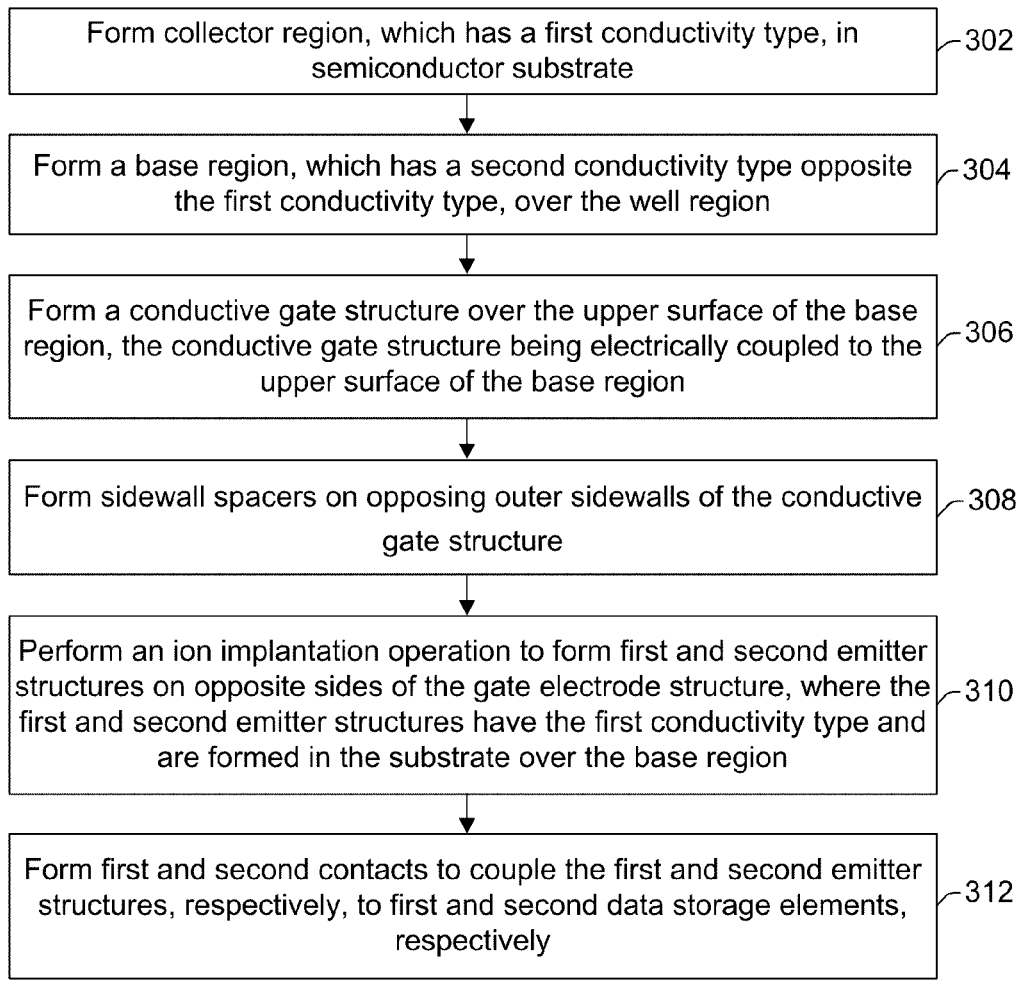
FIG. 3 shows a flow chart illustrating some embodiments of a method for manufacturing a memory device.
Figure 4:
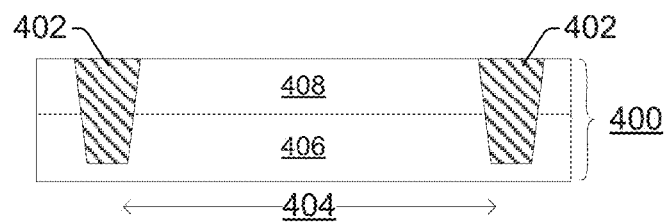
FIGS. 4-13 are a series of cross-sectional views collecting depicting some embodiments of a method for manufacturing a memory device.

The present disclosure will now be described with reference to the attached drawing figures, wherein like reference numerals are used to refer to like elements throughout, and wherein the illustrated structures and devices are not necessarily drawn to scale.

Aspects of the present disclosure relate to memory device, such as magnetic random access memory (MRAM) or resistive random access memory (RRAM) which utilize a vertical BJT access transistor. The use of the BJT access transistor facilitates denser memory storage than previously achievable, and also promotes reduced current leakage relative to some implementations.

FIG. 1 shows a top view of a memory device 100 in accordance with some embodiments that includes a number of memory cells arranged in a series of columns and rows. For purposes of illustration, FIG. 1's memory cells are arranged in three rows and three columns wherein the individual cells are labeled $C_{row-column}$, although typical embodiments will include thousands, millions or other numbers of rows and columns that collectively establish a memory array to store digital data. Wordlines are coupled to neighboring cells along respective columns (e.g., wordline WL1 is coupled to neighboring cells $c_{1,1a}$ and $C_{1,1b}$; $C_{1,2a}$ and $C_{1,2b}$, $C_{1,3a}$ and $C_{1,3b}$ along column 1), and a pair of bitlines (e.g., BL1a and BL1b) are coupled to cells ($C_{1,1a}$ and $C_{1,1b}$; $C_{2,1a}$ and $C_{2,1b}$, $C_{3,1a}$ and $C_{3,1b}$) along respective rows (e.g., Row1). Often, the bitlines are implemented in parallel metal lines (e.g., metal 1 or metal 2 lines), which are closely spaced.

FIG. 2A is a cross-sectional view of first and second neighboring memory cells (i.e., $C_{1,1a}$ and $C_{1,1b}$) formed on a semiconductor substrate 200 and which include first and second data storage elements 202, 204, respectively, to store data states for the respective cells $C_{1,1a}$, $C_{1,1b}$. The data storage elements 202, 204 can be resistive data storage elements or magnetic data storage elements, for example. First and second bit lines (BL1a, BL1b), which are formed in an upper level interconnect layer, are coupled to upper portions of the first and second data storage elements 202, 204, respectively, through respective contacts/vias 206, 208. A gate structure 210, which acts as a shared word line (WL1) for the first and second data storage elements 202, 204, straddles a boundary between the first and second memory cells $C_{1,1a}$, $C_{1,1b}$.

Notably, the first and second memory cells $C_{1,1a}$, $C_{1,1b}$ include respective vertical BJTs 214, 216 that are configured to selectively couple a source line to the first and second data storage elements 202, 204, respectively, based on a word line voltage applied to the word line WL1. Because the vertical BJTs 214, 216 are compact from an area standpoint, these vertical BJTs 214, 216 help to provide a dense layout for the memory array. In addition, the vertical BJTs 214, 216 provide good protection against current leakage. FIG. 2B shows an equivalent circuit schematic for FIG. 2A's cross-section.

As shown in FIG. 2A, to implement these vertical BJTs, a collector region in the form of a deep well region 212 is formed in the semiconductor substrate 200. The collector region 212 has a first conductivity type (e.g., n–) and is coupled to a source line SL of the memory device. A base region 218 is formed in the semiconductor substrate over the collector region 212 and has a second conductivity type (e.g., p–). The gate structure 210 is coupled to the base region 218 and, as previously mentioned, acts as a shared word line for first and second neighboring memory cells. First and second emitter regions 220, 222 are formed in the substrate 200 over the base region 218. The first and second emitter regions 220, 222 have the first conductivity type, and are arranged on opposite sides of the gate structure 210.

During operation, control circuitry biases the word lines, bit lines, and source lines of the memory array according to pre-determined bias conditions to read and write individual data states to the individual cells. In some embodiments, each individual cell stores a binary logic state (e.g., a logical "1" or a logical "0"), but in other embodiments each individual cell can each store a multilevel data state. In such a multilevel configuration, each cell can store a state representing more than two logic states—for example, four or eight logic states. Although multi-level data states may require greater precision when writing data to and/or reading data from the individual cells, they can tend to promote higher density data storage in the array compared to binary storage.

Table 1 below illustrates an example biasing scheme that can be used to write binary data states (e.g., "1" and "0" data states) to the memory device of FIGS. 1 and 2A-2B.

TABLE 1

Applied biases for binary write operations

| Operation | Write "1" | | Write "0" | |
| --- | --- | --- | --- | --- |
| | Selected cell | Non-selected cell | Selected Cell | Non-selected cell |
| WL | High | Floating | High | Floating |
| BL | High | Floating | Low | Floating |
| SL | Low | Low | High | High |

For example, to write to the cells of column 1 in FIG. 1, WL1 is driven high and WL2-WL3 are left floating. This places the vertical BJTs for the cells of column 1 into conductive states, i.e., accesses the cells of column 1, and couples the sourceline SL to the data storage elements for the accessed cells. Other un-accessed cells (e.g., columns 2-3) have the sourceline decoupled from their data storage elements. To write a "1" value to an accessed cell of column 1, the cell's bit line is driven high, while the sourceline is driven low. After this bias condition is applied for a sufficient duration of time, the wordline, bit line, and source lines can be de-asserted and the "1" value will remain programmed in the accessed cell. After the "1" values are written, the "0" values can be written to desired cells by driving the sourceline high and concurrently driving the corresponding bitlines low while the wordline is asserted. Again, after this bias is applied for a sufficient duration of time, the wordline, bitlines, and sourceline can be de-asserted and the "0" value will remain programmed in the accessed cells.

Table 2 below illustrates an example biasing scheme that can be used to read data from the memory device of FIGS. 1 and 2A-2B.

TABLE 2

Applied biases for read operations

| Operation | Read | |
| --- | --- | --- |
| | Selected cell | Non-selected cell |
| WL | High | Floating |
| BL | Low | Floating |
| SL | Medium | High |

FIG. 3 shows some embodiments of a method of manufacturing a memory device. The method is illustrated and now described as a series of acts or blocks. It will be appreciated that some of the acts or blocks may be further subdivided into multiple acts or blocks in some implementations, or may multiple illustrated acts or blocks can be combined in other implementations. Additional un-illustrated acts or blocks may also be present, and/or illustrated acts or blocks may be omitted in some implementations. Also, the order of the acts or blocks may be re-ordered in some embodiments. All such changes are contemplated as falling within the scope of the present disclosure.

FIG. 3's method 300 starts at 302 when a collector region, which has a first conductivity type, is formed in semiconductor substrate. In 304, a base region, which has a second conductivity type opposite the first conductivity type, is formed over the well region. In 306, a conductive gate structure, which acts as a wordline, is formed over the base region and electrically coupled thereto. In 308, sidewall spacers are formed on opposing outer sidewalls of the conductive gate structure. In 310, an ion implantation operation is performed to form first and second emitter structures on opposite sides of the gate electrode structure. The first and second emitter structures, which are self-aligned with the gate structure and sidewall spacers when formed in this manner, have the first conductivity type and are formed in the substrate over the base region. In 312, first and second contacts are formed to couple the first and second emitter structures, respectively, to first and second data storage elements, respectively.

FIGS. 4-13 show a more detailed method for manufacturing a memory device in accordance with some embodiments. The more detailed method begins in FIG. 4, where a semiconductor substrate 400 is provided. The semiconductor substrate 400 includes isolation structures 402, such as shallow trench isolation (STI) structures in which dielectric regions are formed in trenches that laterally surround an active area 404 of the substrate. A deep well region 406 having a first conductivity type (e.g., n-well), which can constitute a collector region, is formed in the substrate. A shallow well region 408 having a second conductivity type (e.g., p-well), which can constitute a base region, is formed over the deep well region 406.

The substrate 400 can be a bulk semiconductor wafer, such as a silicon wafer, a binary compound substrate (e.g., GaAs wafer), a ternary compound substrate (e.g., AlGaAs), or higher order compound wafers, among others. Further, the semiconductor substrate 400 can also include non semiconductor materials such as oxide in silicon-on-insulator (SOI), partial SOI substrate, polysilicon, amorphous silicon, or organic materials, among others. In some embodiments, the semiconductor substrate 400 can include multiple wafers or dies which are stacked or otherwise adhered together. The semiconductor substrate 400 can include wafers which are cut from a silicon ingot, and/or any other type of semiconductor/non-semiconductor and/or deposited or grown (e.g. epitaxial) layers formed on an underlying substrate.

Figure 5:
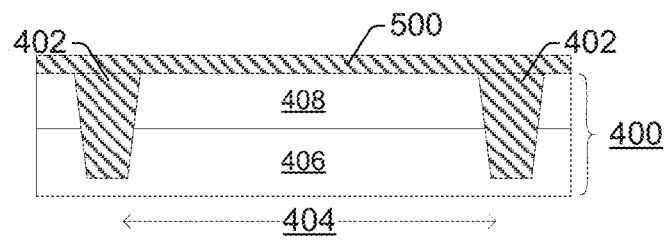
Figure 6:
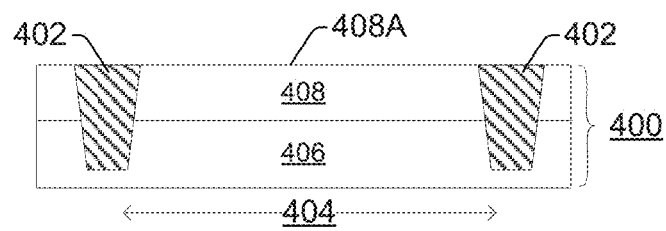

In FIG. 5, a gate dielectric 500 is formed over the base region 408. Although the gate dielectric 500 is removed from over the base region 408 within the memory array (see FIG. 6 wherein an upper surface 408a of the base region 408 is exposed after gate dielectric 500 has been removed), the gate dielectric 500 is often left in place over other portions of the memory device and/or other portions of the integrated circuit where MOS type transistors are formed.

Figure 7:
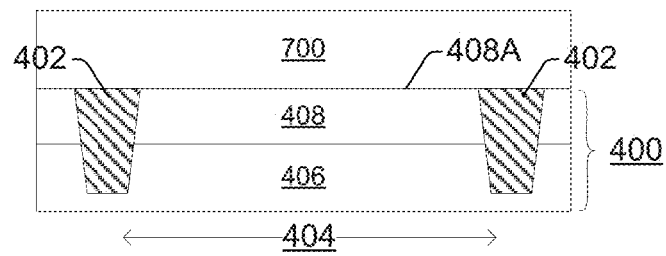

In FIG. 7, a conductive gate layer 700 is formed over the base region 408 directly on the upper surface 408A. The conductive gate layer 700 is often polysilicon, although it could also be metal or another conductive material.

Figure 8:
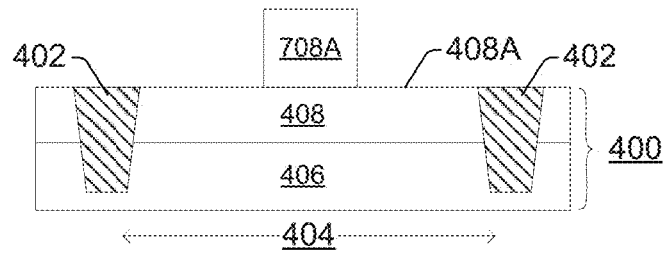

In FIG. 8, the conductive gate layer 700 is patterned to form a conductive gate electrode 708A. Because the gate oxide has been completely or at least partially removed, the conductive gate electrode 708A is electrically coupled to the base region 408.

Figure 9:
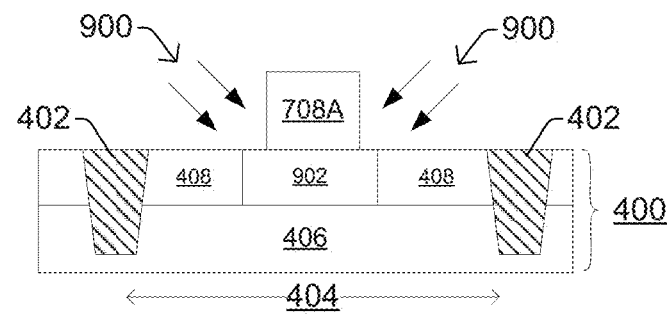

In FIG. 9, an angled implant 900 is performed to form a highly doped, pocket implant region 902 under the gate electrode 708A. The angled implant 900 has the second conductivity type (e.g., p+), and is implanted such that the pocket implant region 902 usually has a higher dopant concentration than the base regions 408.

Figure 10:
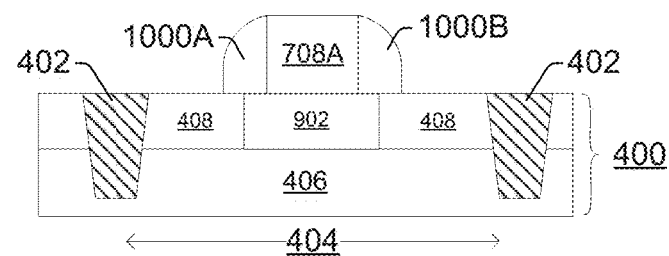

In FIG. 10, sidewall spacers 1000A, 1000B are formed on opposite sides of the conductive gate electrode 708A. The sidewall spacers include a dielectric material, such as nitride or oxide, however, other materials can also be used.

Figure 11:
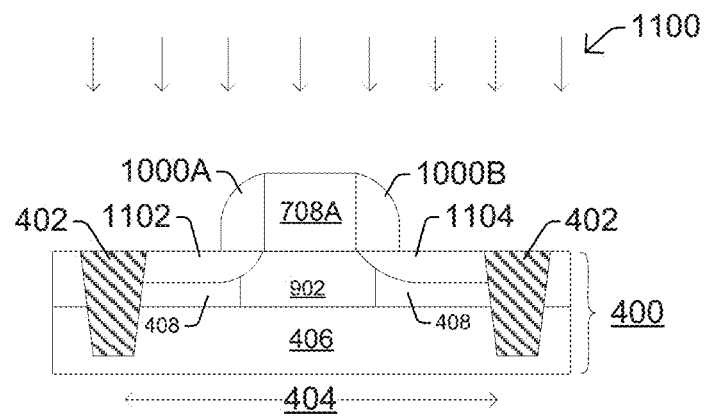

In FIG. 11, an emitter implant 1100 is carried out. The emitter implant has the first conductivity type (e.g., n+), and is implanted to provide a high doping concentration for first and second emitter regions 1102, 1104. Because the emitter implant is carried out with the conductive gate electrode 708A and spacers 1000A, 100B in place, the first and second emitter regions 1102, 1104 are said to be self-aligned with respect to the conductive gate structure and spacers.

Figure 12:
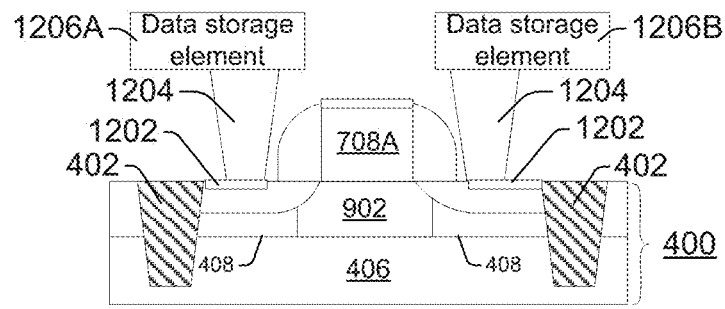

In FIG. 12, silicide regions 1202 are formed near upper surfaces of the first and second emitter regions 1102, 1104, as well as on an upper surface of the conductive gate electrode 708A, and contacts 1204 which are ohmically coupled to the emitter regions via the silicides are formed thereafter. After the contacts 12024 have been formed, first and second data storage elements 1206A, 1206B are formed over the substrate. In some implementations, the data storage elements 1206A, 1206B are magnetic memory storage elements, wherein magnetization of a magnetic memory storage element represents a data state stored in the cell. In other implementations, the data storage elements 1206A, 1206B are resistive memory storage elements, wherein a resistance of the resistive memory storage element represents a data state stored in the cell.

Figure 13:
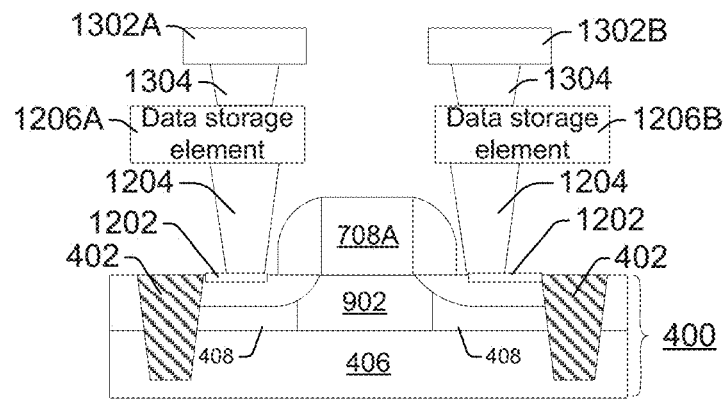

In FIG. 13, first and second bit lines 1302A, 1302B are formed over the data storage elements 1206A, 1206B, respectively, and are coupled to upper regions of the data storage elements through contacts/vias 1304.

Figure 14:
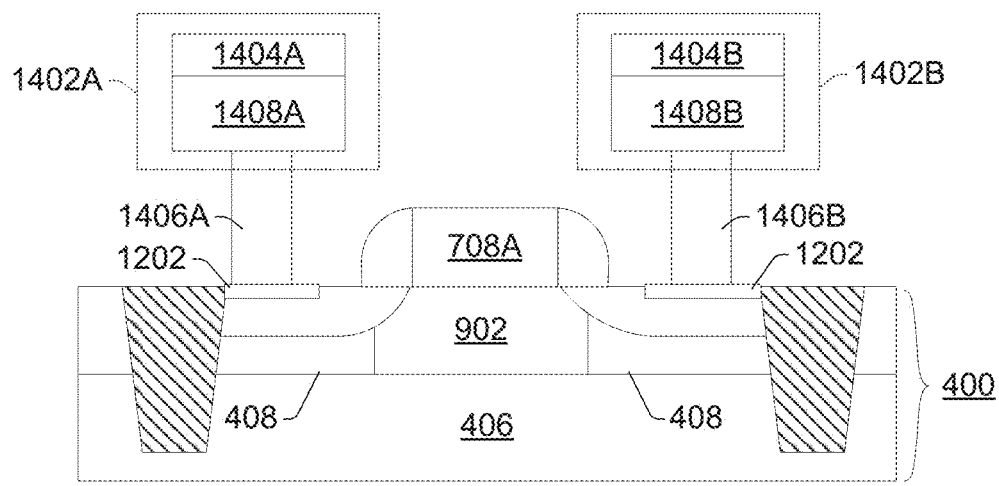
FIG. 14 shows a cross-sectional view of some embodiments of first and second neighboring RRAM cells.

FIG. 14 shows an example cross-section of an RRAM device 1400 that includes data storage elements 1402A, 1402B, wherein the data storage elements are associated with neighboring RRAM cells. Each data storage element 1402A, 1402B includes upper and lower electrodes (e.g., 1404A, 1406A) with a variable resistance region (e.g., 1408A) arranged therebetween, wherein the variable resistance region changes its resistive state based on a current or voltage applied thereto through the upper and lower electrodes. The variable resistance region may be reset (e.g., broken or made into an amorphous silicon region, resulting in high resistance) or set (re-formed or made into a polycrystalline silicon region, resulting in lower resistance) by an appropriately applied voltage or current. A large number of inorganic and organic material systems showing thermal or ionic resistive variable resistance effects can be used for the variable resistance region 1408, including but not limited to: phase change chalcogenides like $Ge_2Sb_2Te_5$ or AgInSbTe; binary transition metal oxides like NiO or $TiO_2$; perovskites like $Sr(Zr)TiO_3$ or PCMO; solid-state electrolytes like GeS, GeSe, or $Cu_2S$; organic charge transfer complexes like CuTCNQ; organic donor-acceptor systems like Al AlDCN; and/or various molecular systems.

The disclosed concepts are also applicable to MRAM devices. In an MRAM cell, the data storage element for each MRAM cell includes an upper ferromagnetic plate and a lower ferromagnetic plate, which are separated by a thin insulating layer also referred to as a tunnel barrier layer. One of the two ferromagnetic plates, for example the lower plate, is a magnet that is pinned to an antiferromagnetic layer. The other ferromagnetic plate, for example the upper plate, is a free magnetic layer that can have its magnetic field changed to one of two or more values to store one of two or more corresponding data states. Each data storage element can be written to by controlling the amount of current passed through the data storage element, wherein the current passed through the data storage element induces a change in the magnetic field of the magnetic free layer. Due to the magnetic tunnel effect, the electrical resistance of the data storage element changes in accordance with the magnetic fields stored on the two plates for the cell. Hence, by measuring the electrical resistance of the data storage element for the cell, read circuitry on the memory device can discern between "0" and "1" data states (and/or multi-bit digital values) stored in the data storage element.

Although some embodiments have been described above where a first conductivity type is n-type and a second conductivity type is p-type, it will be appreciated that in other embodiments the first conductivity type can be p-type and the second conductivity type can be n-type. Thus, the polarity of the BJTs can be "flipped" along with a corresponding change in biasing applied. Also, although some embodiments may be described and illustrated with regards to "rows" and "columns" it will be appreciated that rows and columns can be exchanged with one another in various implementations and are not necessary perfectly orthogonal to one another.

Thus, it will be appreciated that some aspects of the present disclosure relate to a memory device. The memory device includes a collector region formed in a semiconductor substrate. The collector region has a first conductivity type and is coupled to a source line of the memory device. A base region is formed in the semiconductor substrate over the collector region and has a second conductivity type. A gate structure is coupled to the base region and acts as a shared word line for first and second neighboring memory cells of the memory device. First and second emitter regions are formed in the substrate over the base region and have the first conductivity type. The first and second emitter regions arranged on opposite sides of the gate structure. First and second contacts extend upwardly from the first and second emitter regions, respectively, and couple the first and second emitter regions to first and second data storage elements, respectively, of the first and second neighboring memory cells, respectively.

Other embodiments relate to a memory device. The memory device includes an array of memory cell pairs arranged in rows and columns, wherein respective memory cells in a memory cell pair include respective data storage elements arranged to store respective data states. A word line extends in a first direction between memory cells of neighboring memory cell pairs along a column. The word line is coupled to individual memory cells of the memory cell pairs along the word line. Bit lines extend in a second direction that is substantially perpendicular to the first direction and are coupled to data storage elements. A vertical bipolar junction transistor (BJT) is configured to selectively couple a source line to a data storage element based on a word line voltage.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. Further, although the terms "first", "second" "third" and the like are used in this specification, it will be appreciated that such terms are merely generic identifiers and do not imply any spatial or temporal relationship between the various features. Also, although terms such as "upper", "lower", "above", and "below" are used herein, it is to be appreciated that no absolute reference frame (e.g., the ground beneath one's feet) is implied with respect to these and other similar terms. Rather, any coordinate frame can be selected for such terms. In addition, while a particular aspect may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method, comprising:
    forming a collector region, which has a first conductivity type, in a semiconductor substrate;
    forming a base region, which has a second conductivity type opposite the first conductivity type, in the semiconductor substrate and abutting a top portion of the collector region;
    forming a conductive electrode over the base region, the conductive electrode extending over an upper surface of the semiconductor substrate and being electrically coupled to the base region;
    forming first and second emitter structures in the semiconductor substrate on opposite sides of the conductive electrode, the first and second emitter structures having the first conductivity type and abutting the base region;
    forming first and second contacts that are coupled to upper portions of the first and second emitter structures, respectively;
    forming first and second data storage elements over the first and second contacts, wherein the first and second data storage elements are coupled to upper portions of the first and second contacts, respectively;
    forming sidewall spacers on opposing outer sidewalls of the conductive electrode; and
    forming a pocket implant region that is self-aligned with respect to the conductive electrode, wherein the pocket implant region has the second conductivity type.

2. The method of claim 1, further comprising
    forming a gate dielectric over the base region prior to forming the conductive electrode;
    removing the gate dielectric from over the base region to expose an upper surface of the base region; and
    forming the conductive electrode on the exposed upper surface of the base region.

3. The method of claim 1, further comprising:
    forming a pocket implant region, which has the second conductivity type, under outer edges of the conductive electrode.

4. The method of claim 3, wherein the pocket implant region is formed by directing an ion beam at a non-perpendicular angle of incidence relative to the upper surface of the semiconductor substrate.

5. The method of claim 1, further comprising:
    forming a silicide over the first and second emitter structures to provide an ohmic contact between the first and second emitter structures and the first and second contacts, respectively.

6. The method of claim 1, wherein the conductive electrode is made of doped polysilicon.

7. The method of claim 1, wherein the base region comprises:
    an upper base contact region, which has the second conductivity type at a first doping concentration; and
    a lower base region, which has the second conductivity type at a second doping concentration that is less than the first doping concentration;
    wherein the upper base contact region extends upwardly from the lower base region and between the first and second emitter structures to the conductive electrode.

8. A method, comprising:
    carrying out a first ion implantation to form a collector region, which has a first conductivity type, in a semiconductor substrate;
    carrying out a second ion implantation to form first and second base regions in the semiconductor substrate which are spaced apart from one another and which abut the collector region, where first and second base regions have a second conductivity type opposite the first conductivity type;
    forming a conductive electrode over an upper surface of the semiconductor substrate, the conductive electrode extending continuously between the first and second base regions and being electrically coupled to the first and second base regions by two or more respective upper base contact regions extending upwardly to the conductive electrode;
    carrying out a third ion implantation to form first and second emitter structures on opposite sides of the conductive electrode and which abut first base region, where the first and second emitter structures have the first conductivity type;
    forming sidewall spacers on opposite sidewalls of the conductive electrode, wherein first and second emitter structures have edges that are substantially aligned to edges of the sidewall spacers; and
    prior to formation of the sidewall spacers, performing a pocket ion implantation which is non-normal to the upper surface of the substrate, thereby forming pocket implant regions under outer edges of the conductive electrode.

9. The method of claim 8, wherein the upper base contact region is made of semiconductor material having the second conductivity type.

10. The method of claim 8, further comprising:
    forming first and second contacts that are coupled to upper portions of the first and second emitter structures, respectively; and
    forming first and second data storage elements over the first and second contacts, wherein the first and second data storage elements are coupled to the first and second contacts, respectively.

11. The method of claim 10, wherein the first and second data storage elements are magnetic memory elements, wherein a magnetic polarization value for a magnetic memory element corresponds to a data state stored in the magnetic memory element.

12. The method of claim 10, wherein the first and second data storage elements are resistive memory elements, wherein a resistance value for a resistive memory element corresponds to a data state stored in the resistive memory element.

13. A method, comprising:
    carrying out a first ion implantation to form a collector region, which has a first conductivity type, in a semiconductor substrate;

carrying out a second ion implantation to form first and second base regions in the semiconductor substrate which are spaced apart from one another and which abut the collector region, where first and second base regions have a second conductivity type opposite the first conductivity type;

forming a conductive electrode over an upper surface of the semiconductor substrate, the conductive electrode extending continuously between the first and second base regions and being electrically coupled to the first and second base regions by first and second respective upper base contact regions extending downwardly from the conductive electrode;

carrying out a third ion implantation to form first and second emitter structures in the semiconductor substrate and abutting the first and second base regions, respectively, wherein the first and second emitter structures are disposed on one side of the conductive electrode;

performing a pocket ion implantation which is non-normal to the upper surface of the substrate, thereby forming pocket implant regions under outer edges of the conductive electrode; and after performing the pocket ion implantation, forming sidewall spacers on opposite sidewalls of the conductive electrode.

14. The method of claim 13, further comprising:
forming first and second contacts that are coupled to upper portions of the first and second emitter structures, respectively; and forming first and second data storage elements over the first and second contacts, wherein the first and second data storage elements are coupled to the first and second contacts, respectively.

15. The method of claim 14, wherein the first and second data storage elements are magnetic memory elements, wherein a magnetic polarization value for a magnetic memory element corresponds to a data state stored in the magnetic memory element.

16. The method of claim 14, wherein the first and second data storage elements are resistive memory elements, wherein a resistance value for a resistive memory element corresponds to a data state stored in the resistive memory element.

17. The method of claim 1, further comprising:
while forming the base region, concurrently forming a second base region in the semiconductor substrate, wherein the base region corresponds to a first pair of memory cells, and the second base region is spaced apart from the base region and corresponds to a second pair of memory cells; and wherein the conductive electrode extends over the upper surface of the semiconductor substrate and extends continuously between the base region and the second base region and acts as a shared word line for the first and second pairs of memory cells.

18. The method of claim 1, further comprising:
forming first and second bitlines arranged over and coupled to upper portions of the first and second data storage elements, respectively.

19. The method of claim 8, further comprising:
wherein the first base region corresponds to a first pair of memory cells, and the second base region corresponds to a second pair of memory cells; and wherein the conductive electrode acts as a shared word line for the first and second pairs of memory cells.

20. The method of claim 13, further comprising:
wherein the first base region corresponds to a first pair of memory cells, and the second base region corresponds to a second pair of memory cells; and wherein the conductive electrode acts as a shared word line for the first and pairs of memory second cells.

* * * * *